(12) United States Patent
Wang

(10) Patent No.: US 8,848,396 B2
(45) Date of Patent: Sep. 30, 2014

(54) ELECTRONIC DEVICE

(75) Inventor: Wei-Cheng Wang, New Taipei (TW)

(73) Assignee: Wistron Corp., New Taipei (TW)

( * ) Notice: Subject to any disclaimer, the term of this patent is extended or adjusted under 35 U.S.C. 154(b) by 72 days.

(21) Appl. No.: 13/597,084

(22) Filed: Aug. 28, 2012

(65) Prior Publication Data

US 2013/0279143 A1 Oct. 24, 2013

(30) Foreign Application Priority Data

Apr. 24, 2012 (TW) .............................. 101114472 A

(51) Int. Cl.
*H05K 9/00* (2006.01)

(52) U.S. Cl.
USPC ........... 361/818; 361/753; 361/758; 361/759; 361/790; 174/138 E; 174/138 G

(58) Field of Classification Search
CPC ....................................................... H05K 7/02
USPC ........................... 361/729, 818, 753, 758, 759
See application file for complete search history.

(56) References Cited

U.S. PATENT DOCUMENTS

| | | | | |
|---|---|---|---|---|
| 6,017,226 A * | 1/2000 | Jeffries et al. | ................... | 439/92 |
| 6,771,512 B2 * | 8/2004 | Paquin et al. | ................. | 361/752 |
| 6,813,159 B2 * | 11/2004 | Irie et al. | ....................... | 361/752 |
| 6,924,855 B2 * | 8/2005 | Chung | ............................ | 349/58 |
| 6,972,963 B1 * | 12/2005 | Chou | ............................ | 361/760 |
| 7,170,759 B2 * | 1/2007 | Soga | ............................ | 361/825 |
| 7,394,186 B2 * | 7/2008 | Kim | .................................. | 313/46 |
| 7,411,796 B2 * | 8/2008 | Lee et al. | ....................... | 361/807 |
| 7,583,517 B2 * | 9/2009 | Hartman et al. | ............... | 361/810 |
| 7,766,680 B2 * | 8/2010 | Suzuki et al. | ................. | 439/260 |
| 7,839,658 B2 * | 11/2010 | Kim | .................................. | 361/807 |
| 8,139,365 B2 * | 3/2012 | Jung | ............................... | 361/753 |
| 8,363,416 B2 * | 1/2013 | Miyazaki | ...................... | 361/749 |
| 8,520,398 B2 * | 8/2013 | Zhao et al. | .................... | 361/752 |
| 2008/0169391 A1 * | 7/2008 | Lin | ............................ | 248/205.1 |
| 2008/0202802 A1 * | 8/2008 | Lu | .................................. | 174/261 |
| 2013/0258611 A1 * | 10/2013 | Li et al. | ......................... | 361/748 |

FOREIGN PATENT DOCUMENTS

| | | |
|---|---|---|
| CN | 102402252 A | 4/2012 |
| TW | 201124962 | 7/2011 |

OTHER PUBLICATIONS

Taiwan Patent Office, Office Action, Patent Application Serial No. 101114472, Jan. 6, 2014, Taiwan.
Taiwan Patent Office, Office Action, Patent Application Serial No. 101114472, Jun. 23, 2014, Taiwan.

* cited by examiner

*Primary Examiner* — Timothy Thompson
*Assistant Examiner* — Rashen E Morrison

(57) ABSTRACT

An electronic device includes a metal shield, a housing, a circuit board, an engaging element, and a fixing element. The circuit board is located between the metal shield and the housing. The engaging element is disposed on the circuit board. The circuit board is fixed on the housing and connected to the metal shield via the engaging element.

9 Claims, 6 Drawing Sheets

ELECTRONIC DEVICE

CROSS-REFERENCE TO RELATED APPLICATIONS

This Application claims priority of Taiwan Patent Application No. 101114472, filed on Apr. 24, 2012, the entirety of which is incorporated by reference herein.

BACKGROUND OF THE INVENTION

1. Field of the Invention

The invention relates to an electronic device, and in particular to an electronic device having an engaging element.

2. Description of the Related Art

A conventional liquid crystal display, LCD, includes a display module, a metal shield, a circuit module and a housing. The metal shield covers the display module to protect from electromagnetic interference, EMI. The circuit module controls the display of the display module. A circuit board of the circuit module is fastened to the metal shield, and is electrically connected to the display module. The housing covers the metal shield to protect the circuit board and the display module.

However, when the circuit module is modified, the size of the circuit board may be different, and the positions of lock holes on the circuit board may be inconsistent. Therefore, a new metal shield is needed to ensure that the lock holes of the circuit board correspond to the lock holes of the metal shield, and thus manufacturing costs increase.

Moreover, if the circuit board is fastened to the housing directly, the housing may have a post for a screw to be fastened thereon, and the complexity of the housing increases. Further, since the circuit board is electrically connected to the display module after the circuit board is fixed to the housing, the difficulty of assembling the liquid crystal display increases.

BRIEF SUMMARY OF THE INVENTION

The objective of the present invention is to provide an electronic device that solve the problems of the prior art.

For the above objective, the present invention provides an electronic device including a metal shield, a housing, a circuit board, an engaging element, and a fixing element. The housing covers the metal shield. The circuit board is located between the metal shield and the housing. The engaging element includes a retaining body and a conductive element. The retaining body is disposed on the circuit board. The conductive element is disposed on the retaining body, and contacts with the metal shield and the circuit board. The fixing element is connected to the housing and the retaining body.

In conclusion, the circuit board is stably disposed in the electronic device by the engaging element of the present invention. When the circuit board is replaced with a new design, a new metal shield may not be needed, and thus manufacturing costs decrease. Further, since the circuit board is electrically connected to the display module before the circuit board is fixed to the housing, the difficulty of assembling the electronic device decreases.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
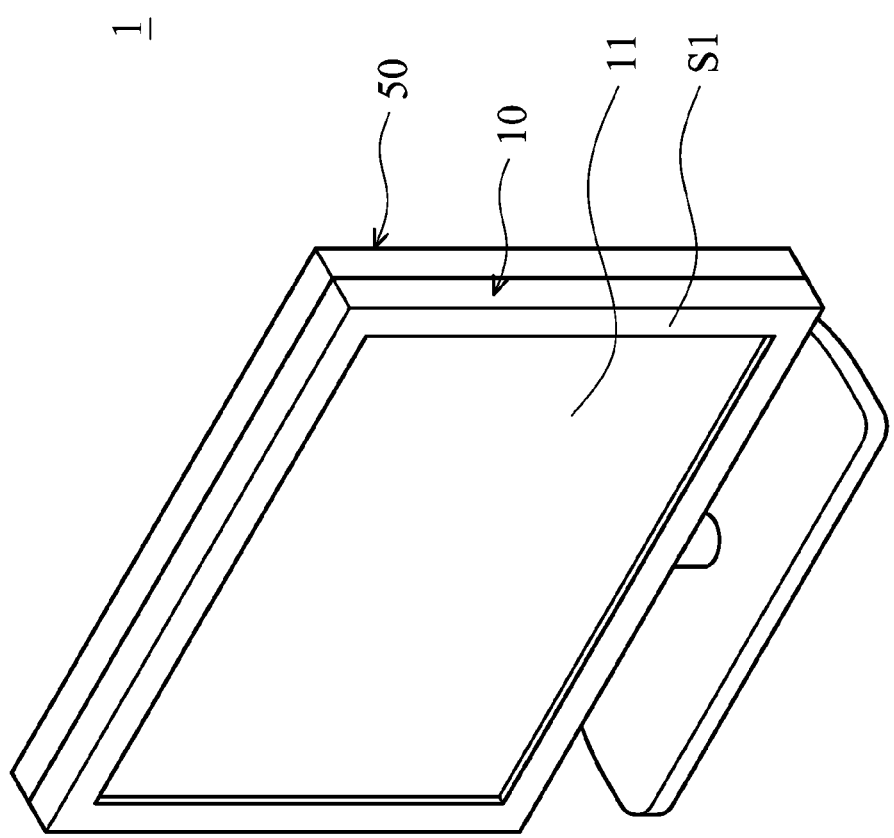
FIG. 1 is a perspective view of an electronic device according to an embodiment of the invention.
Figure 2:
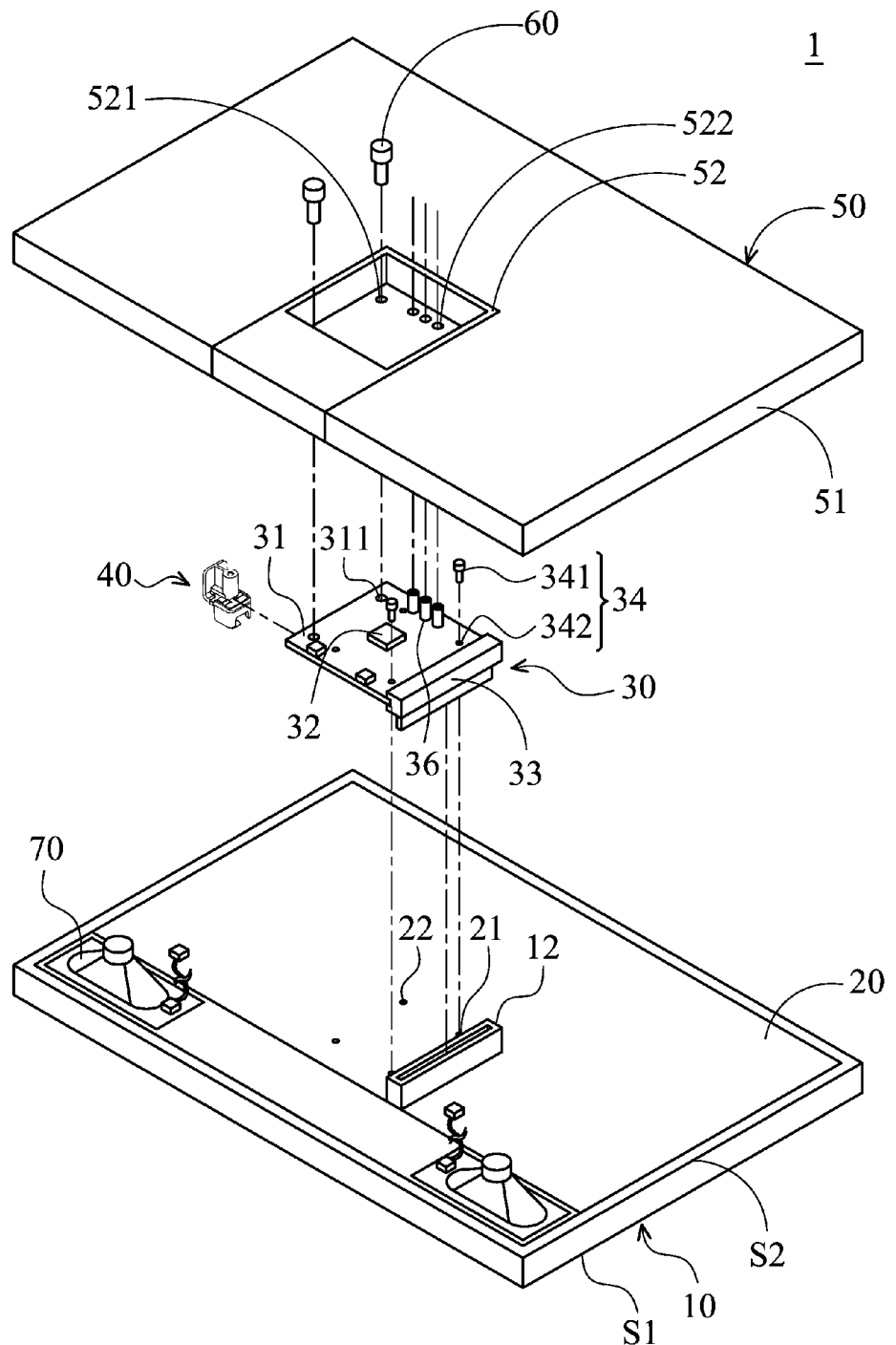
FIG. 2 is an exploded view of the electronic device according to an embodiment of the invention.

FIG. 1 is a perspective view of an electronic device 1 according to an embodiment of the invention, and FIG. 2 is an exploded view of the electronic device 1 according to an embodiment of the invention. As shown in FIGS. 1 and 2, the electronic device 1 may be a display device including a display module 10, a metal shield 20, a circuit module 30, an engaging element 40, and a housing 50. The display module 10 includes a panel 11 and a first connector 12. The panel 11 is exploded from the display surface S1 of the display module 10. The first connector 12, which may be a slot connector, is coupled to the panel 11, and passes through the metal shield 20.

The metal shield 20 covers a rear surface S2 of the display module 10, and is electrically connected to the display module 10 to prevent electromagnetic interference, EMI.

The circuit module 30 is electrically connected to the display module 10 and controls the display module 10. The circuit module 30 includes a circuit board 31, a plurality of electronic components 32, a second connector 33, a positioning structure 34, and a plurality of signal terminals 36. The circuit board 31 is located between the metal shield 20 and the housing 50, and is fixed on the housing 50 by the engaging element 40. The circuit board 31 is electrically connected to the metal shield 20, and includes a plurality of latching holes 311.

The electronic component 32 may be a processing chip, for example. The electronic component 32 and the second connector 33 are disposed on the circuit board 31, and the electronic component 32 is coupled to the circuit board 31 and the second connector 33. The second connector 33 may be plugged on the first connector 12 to position the circuit board 31 on the metal shield 20 and the display module 10, and to electrically connect the circuit board 31 with the display module 10.

The positioning structure 34 is disposed on the circuit board 31 and the metal shield 20 to position the circuit board 31 on the metal shield 20. In the embodiment, the positioning structure 34 includes a screw 341 and a lock hole 342. The lock hole 342 is disposed on the circuit board 31, the circuit board 31 is fastened on the lock hole 21 of the metal shield 20 by the screw 341, and the circuit board 31 is fixed to the metal shield 20.

Since the circuit module 30 may employ different designs, the size of the circuit board 31, and the positions of the latching hole 311 and the lock hole 342 may be different. The latching hole 311 of the circuit board 31 may not correspond to the lock hole 22, and the lock hole 342 near the first connector 12 may correspond to the lock hole 21. Therefore, the circuit board 31 may be fastened to the metal shield 20 by the screw 341. If the lock hole 342 does not correspond to the lock hole 21, the screw 341 can be omitted.

Figure 3:
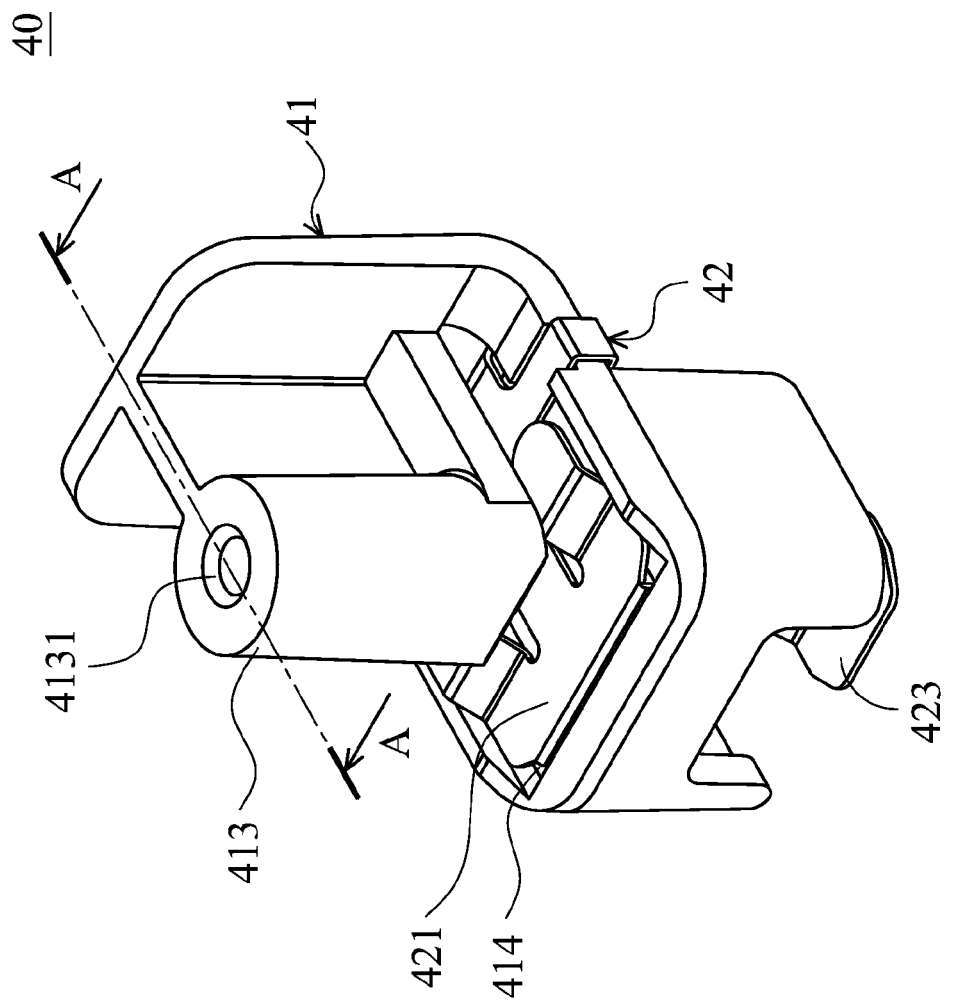
FIG. 3 is a perspective view of the engaging element according to an embodiment of the invention.
Figure 4:
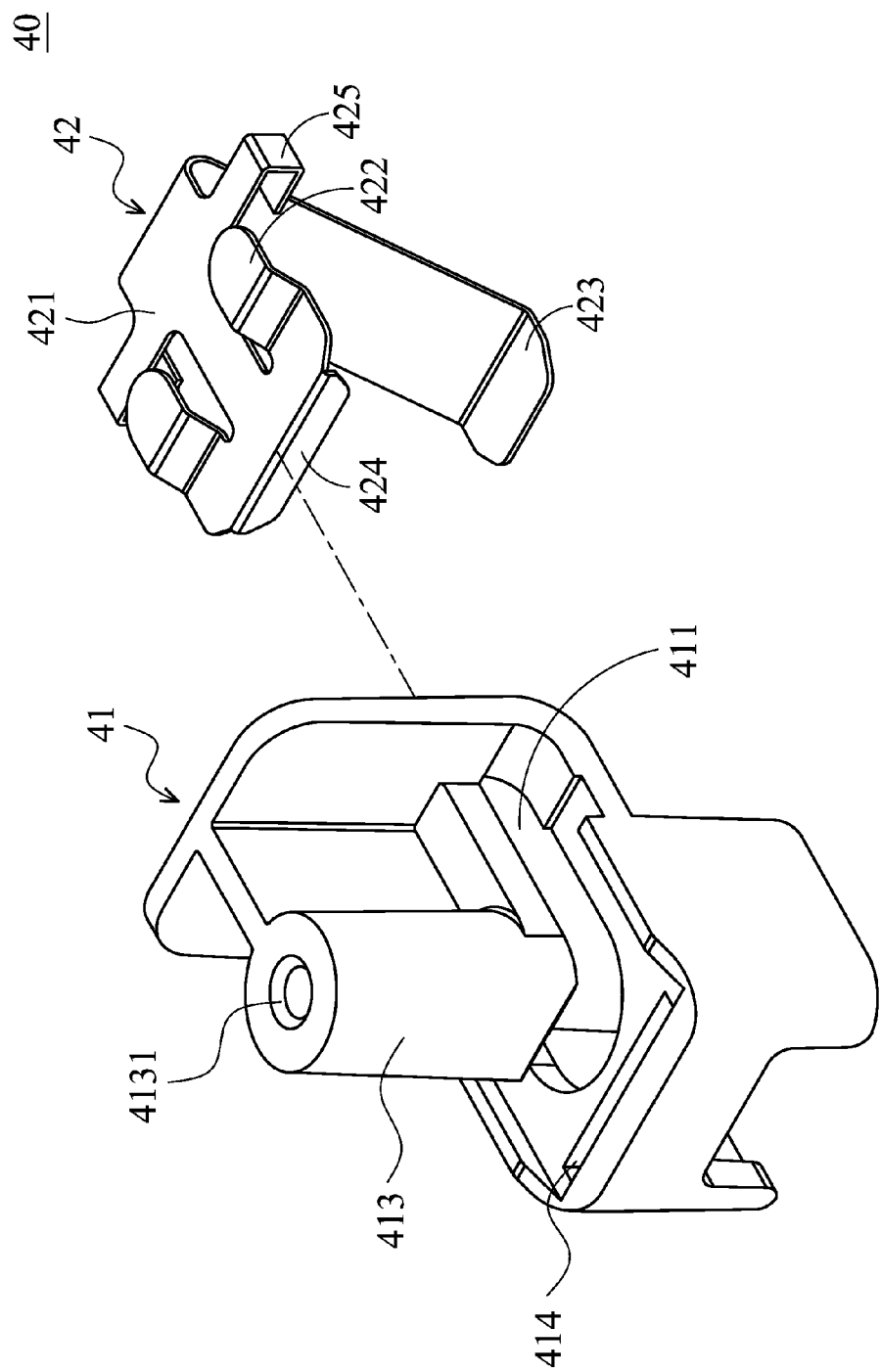
FIG. 4 is an exploded view of the engaging element according to an embodiment of the invention.
Figure 5:
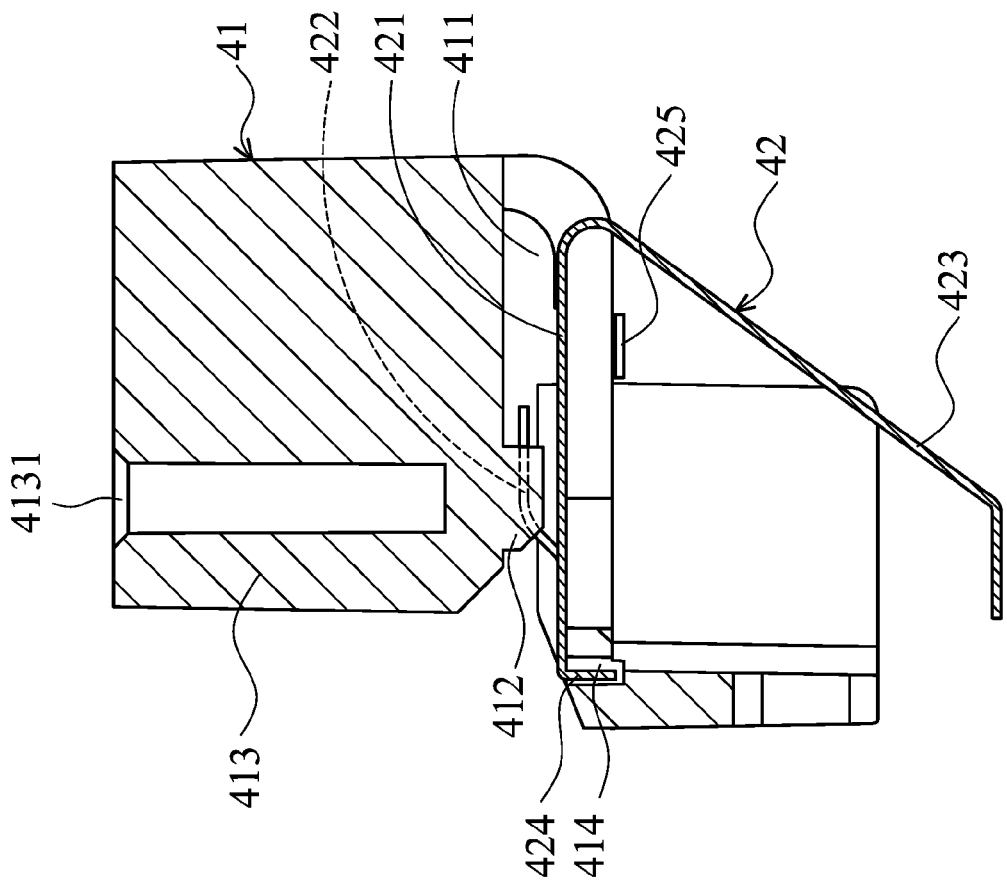
FIG. 5 is a cross-sectional view of cross-sectional line A-A of FIG. 3.
Figure 6:
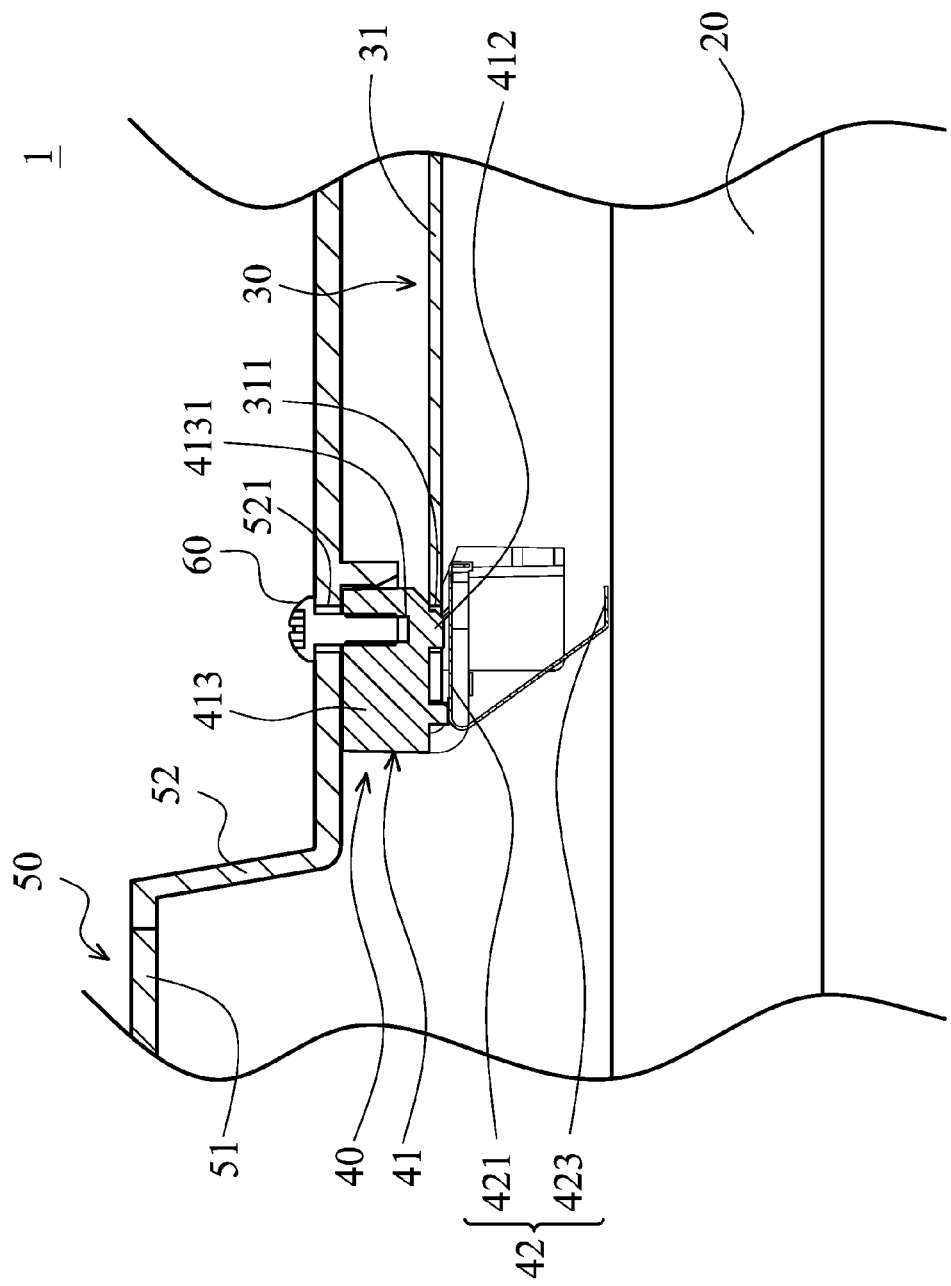
FIG. 6 is a cross-sectional view of the electronic device according to an embodiment of the invention.

FIG. 3 is a perspective view of the engaging element 40 according to an embodiment of the invention. FIG. 4 is an exploded view of the engaging element 40 according to an embodiment of the invention. FIG. 5 is a cross-sectional view of cross-sectional line A-A of FIG. 3. FIG. 6 is a cross-sectional view of the electronic device 1 according to an embodiment of the invention. The engaging element 40 includes a retaining body 41 and a conductive element 42. The retaining body 41 is disposed on the circuit board 31, and the circuit board 31 and the metal shield 20 are separated by the retaining body 41.

The retaining body 41 may be made from plastic materials. The retaining body 41 has a retaining groove 411, a retaining protrusion 412, a fixing portion 413 and a retaining hole 414. The retaining protrusion 412 is disposed on the fixing portion 413, and located in the retaining grooves 411. The fixing portion 413 has a fixing hole 4131. As shown in FIGS. 5 and 6, when the circuit board 31 is plugged on the retaining groove 411, the retaining protrusion 412 is retained to the latching hole 311 to install the engaging element 40 on the circuit board 31. Then, the fixing portion 413 and the conductive element 42 are located at two opposite sides of the circuit board 31.

The conductive element 42 may be an elastic piece disposed on the retaining body 41, contacting with the metal shield 20 and the circuit board 31. The circuit board 31 may be grounded through the conductive element 42. The conductive element 42 includes a conductive body 421, a first elastic portion 422, a second elastic portion 423, a first latching portion 424, and a second latching portion 425. The conductive body 421 is located in the retaining groove 411. The first elastic portion 422 and the second elastic portion 423 may be a bending structure respectively extended from the conductive body 421. The first elastic portion 422 is extended from the conductive body 421 to the retaining groove 411, and electrically connected to the circuit board 31. The second elastic portion 423 is extended from the conductive body 421 to the metal shield 20.

The first latching portion 424 and the second latching portion 425 are extended from the conductive body 421. Since the first latching portion 424 is retained to the retaining hole 414, and the second latching portion 425 is retained to the retaining body 41, the conductive element 42 is fixed on the retaining body 41.

The housing 50 covers the metal shield 20, and the circuit board 31 is located between the housing 50 and the metal shield 20. The housing 50 includes a first housing 51 and a second housing 52. The second housing 52 is detachably disposed on the first housing 51. The second housing 52 has a through hole 521 and a plurality of terminal holes 522. The through hole 521 corresponds to the fixing hole 4131, and the terminal holes 522 correspond to the signal terminals 36. The signal terminals 36 are respectively disposed in the terminal holes 522. The fixing element 60 may be a screw. The fixing element 60 passes through the through hole 521 and is fastened on the fixing hole 4131 to fix the housing 50 on the fixing portion 413 of the retaining body 41.

Moreover, since the through hole 521 is disposed on the housing 50, the structure of the housing 50 is simple, and the difficulty of the manufacture of the housing 50 is decreased.

When a different design is applied to the circuit module 30, the through hole 521 may not correspond to the fixing hole 4131. To solve the problem, the second housing 52 may be replaced by a new second housing with a through hole corresponding to the fixing hole 4131. Alternatively, the shape of the fixing portion 413 and the position of the fixing hole 4131 may be changed to force the fixing hole 4131 to correspond to the through hole 521. Thus, by mounting the engaging element with a different design on the circuit board 31, the through hole 521 corresponds to the fixing hole 4131 without a new housing 50 or metal shield 20 with a different design, and the manufacturing costs decreases.

When assembly personnel want to assemble the electronic device 1, the engaging element 40 is disposed on the circuit board 31, first, and the first elastic portion 422 of the conductive element 42 of the engaging element 40 contacts the circuit board 31. Next, the second connector 33 of the circuit module 30 is plugged on the first connector 12 of the display module 10 to position the circuit module 30 on the display module 10 or the metal shield 20. Moreover, the second elastic portion 423 of the conductive element 42 makes contact with the metal shield 20 to electrically connect the circuit board 31 with the metal shield 20. Thus, the grounding process of the circuit board 31 may be simplified. Further, before the circuit board 31 is fixed to the housing 50, the electronic component 70 of the electronic device 1, such as loudspeakers, could be connected to the circuit board 31.

Finally, the housing 50 is disposed on the metal shield 20, and covers the circuit board 31. The housing 50 is fastened to the engaging element 40 by the fixing element 60 passing through the through hole 521 of the housing 50 to complete the assembly of the electronic device 1.

In conclusion, the circuit board is stably disposed in the electronic device by the engaging element of the present invention. When the circuit board is replaced with a new design, a new metal shield may not be needed, and thus manufacturing costs decrease. Further, since the circuit board is electrically connected to the display module before the circuit board is fixed to the housing, the difficulty of assembling the electronic device decreases.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a metal shield;
   a housing covering the metal shield;
   a circuit board located between the metal shield and the housing;
   an engaging element comprising
     a retaining body disposed on the circuit board; and
     a conductive element, disposed on the retaining body, contacting with the metal shield and the circuit board; and
   a fixing element connected to the housing and the retaining body,
   wherein the conductive element is located between the circuit board and the metal shield.

2. The electronic device as claimed in claim 1, wherein the housing has a through hole, the retaining body has a fixing portion, and the fixing element passes through the through hole to fix the housing to the fixing portion.

3. The electronic device as claimed in claim 1, further comprising a display module having a first connector, wherein the metal shield covers a rear surface of the display module.

4. The electronic device as claimed in claim 3, further comprising a second connector disposed on the circuit board, and plugged on the first connector.

5. The electronic device as claimed in claim 1, further comprising a positioning structure disposed on the circuit board and the metal shield.

6. The electronic device as claimed in claim 5, wherein the positioning structure comprises a lock hole disposed on the circuit board and a screw passing through the lock hole, and the circuit board is fastened to the metal shield by the screw.

7. The electronic device as claimed in claim 1, wherein the retaining body comprises a retaining groove and a retaining protrusion disposed in the retaining groove, and the circuit board comprises a latching hole, wherein the circuit board is plugged on the retaining groove and the retaining protrusion is retained in the latching hole.

8. The electronic device as claimed in claim 1, wherein the conductive element comprises

- a conductive body located in the retaining groove;
- a first elastic portion extended from the conductive body to the retaining groove, and connected to the circuit board; and
- a second elastic portion extended from the conductive body to the metal shield.

9. The electronic device as claimed in claim 8, wherein the conductive element is an elastic piece.

\* \* \* \* \*